United States Patent
Hartman et al.

(10) Patent No.: US 7,583,517 B2
(45) Date of Patent: Sep. 1, 2009

(54) METHOD AND APPARATUS FOR COUPLING A CARD TO AN INFORMATION HANDLING SYSTEM CHASSIS

(75) Inventors: Corey Hartman, Austin, TX (US); Lawrence A. Kyle, Salado, TX (US)

(73) Assignee: Dell Products L.P., Round Rock, TX (US)

( * ) Notice: Subject to any disclaimer, the term of this patent is extended or adjusted under 35 U.S.C. 154(b) by 510 days.

(21) Appl. No.: 11/481,492

(22) Filed: Jul. 6, 2006

(65) Prior Publication Data

US 2008/0007931 A1    Jan. 10, 2008

(51) Int. Cl.
*H05K 7/02* (2006.01)
*H05K 7/04* (2006.01)

(52) U.S. Cl. ...................... 361/810; 361/807
(58) Field of Classification Search ................ 361/810, 361/807, 600, 679, 728, 729; 174/138 G, 174/138 E
See application file for complete search history.

(56) References Cited

U.S. PATENT DOCUMENTS

| | | | |
|---|---|---|---|
| 4,966,482 A * | 10/1990 | Fujimoto | 403/24 |
| 5,191,513 A * | 3/1993 | Sugiura et al. | 361/752 |
| 5,281,149 A * | 1/1994 | Petri | 439/66 |
| 5,383,793 A | 1/1995 | Hsu et al. | |
| 6,362,974 B1 * | 3/2002 | Lettang | 361/790 |
| 6,404,118 B1 * | 6/2002 | Park | 313/440 |
| 6,695,634 B1 | 2/2004 | Boggs et al. | |
| 6,738,260 B2 | 5/2004 | Sivertsen | |
| 6,754,085 B2 * | 6/2004 | Kalkbrenner | 361/752 |
| 6,985,367 B1 * | 1/2006 | Scigiel | 361/801 |
| 7,040,905 B1 * | 5/2006 | Wang | 439/76.1 |
| 7,257,870 B2 * | 8/2007 | Deas et al. | 24/453 |
| 7,272,017 B2 * | 9/2007 | Kwatra et al. | 361/807 |

* cited by examiner

*Primary Examiner*—Hung S Bui
(74) *Attorney, Agent, or Firm*—Haynes and Boone, LLP

(57) ABSTRACT

A card coupling apparatus includes a first surface. A locating member extends from the first surface and includes a control surface that is oriented at an angle relative to the first surface and defines a securing channel that is located adjacent the control surface. A plurality of securing devices extend from the first surface in a spaced apart relationship from the locating member, each securing device including a locating post and a securing member located adjacent the locating post. A card may be coupled to the first surface by engaging the locating member and the securing devices with the card. The card may then be decoupled from the first surface by using one hand to disengage the securing members from the card and remove the card from the securing devices.

18 Claims, 10 Drawing Sheets

METHOD AND APPARATUS FOR COUPLING A CARD TO AN INFORMATION HANDLING SYSTEM CHASSIS

BACKGROUND

The present disclosure relates generally to information handling systems, and more particularly to coupling a card to an information handling system chassis.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Some IHSs include cards such as, for example, daughter Printed Wiring Assembly (PWA) cards, that couple in a mezzanine orientation to an IHS chassis and are electrically coupled to a board such as, for example, a PWA motherboard. These cards are mounted in such a way so that they do not take up any Peripheral Component Interface (PCI) slots and they do not need PCI connections for their feature sets, but rather electrically couple to the PWA motherboard with cable connection, docking connectors, or a variety of other non-PCI connections known in the art. The coupling of these cards to the IHS chassis raises a number of issues.

Typically, these cards are coupled to the IHS chassis utilizing four posts, each post having a securing member. The card includes four coupling apertures, and each post is located in a respective coupling aperture such that the securing member engages the card and couples the card to the IHS chassis. To remove the card, the securing member on each post must be disengaged from the card so that the posts may be removed from the coupling apertures. Such a procedure requires the use of two hands and adequate room to access each securing member. Unless the securing members on all the posts are disengaged from the card and the card is removed from the posts simultaneously, the card is prone to moving relative to the posts such that it is recoupled to the IHS chassis by one or more of the securing members. Such conventional coupling apparatus and methods are time consuming to use, non-intuitive, prone to damage the card due to difficulty in removal and installation, prone to damage the board due to difficulty in removal and installation, provide inconsistent mounting heights for connecting and grounding purposes, and include many loose parts.

Furthermore, such conventional apparatus and methods are typically designed for board mounting and don't provide for mounting the card to different locations in the IHS chassis.

Accordingly, it would be desirable to provide for coupling a card to an IHS chassis absent the disadvantages found in the prior devices discussed above.

SUMMARY

According to one embodiment, a card coupling apparatus includes a first surface, a locating member extending from the first surface and comprising a control surface that is oriented at an angle relative to the first surface and defining a securing channel that is located adjacent the control surface, and a plurality of securing devices extending from the first surface in a spaced apart relationship from the locating member, each securing device comprising a locating post and a securing member located adjacent the locating post.

BRIEF DESCRIPTION OF THE DRAWINGS

FIG. 2b is a rear view illustrating an embodiment of a locating member located on the card coupling apparatus of FIG. 2a.

FIG. 2d is a side view illustrating an embodiment of a securing device located on the card coupling apparatus of FIG. 2a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
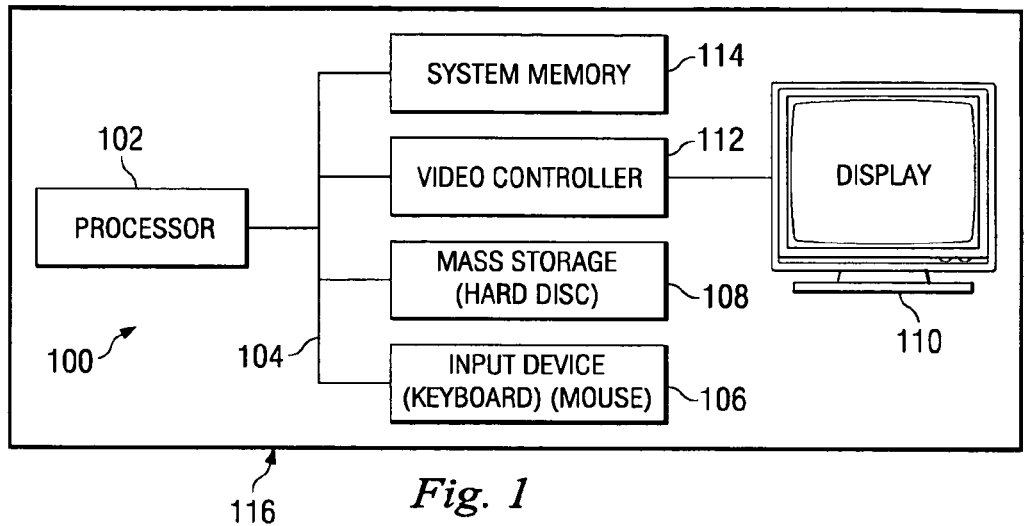
FIG. 1 is a schematic view illustrating an embodiment of an IHS.
Figure 2B:
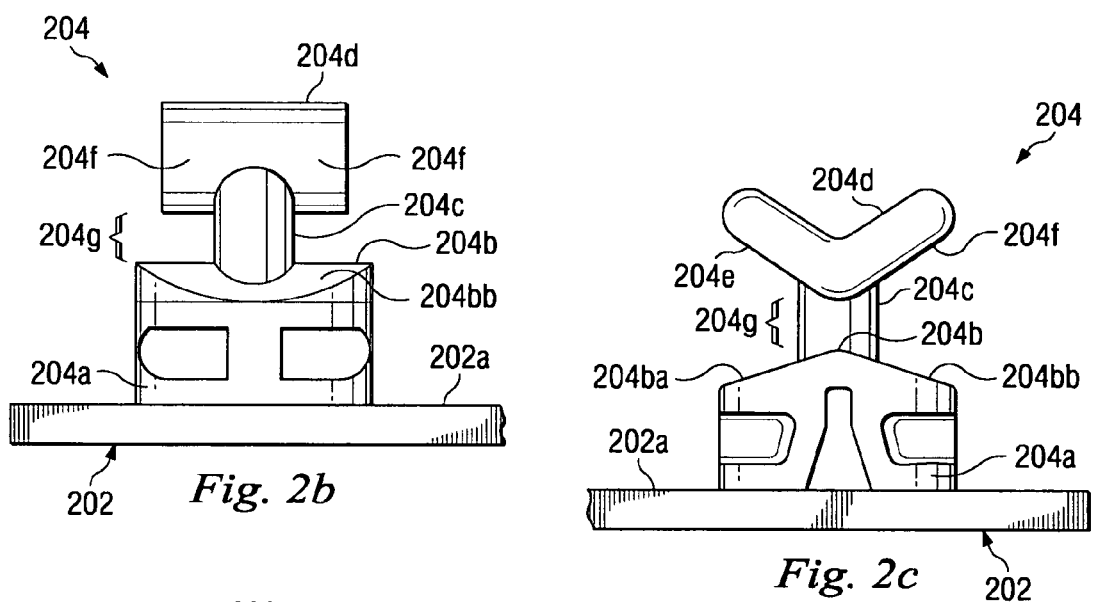
Figure 2C:
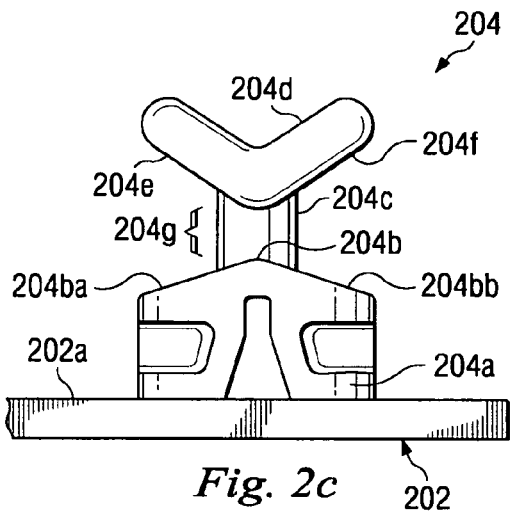
FIG. 2c is a side view illustrating an embodiment of the locating member of FIG. 2b.
Figure 2D:
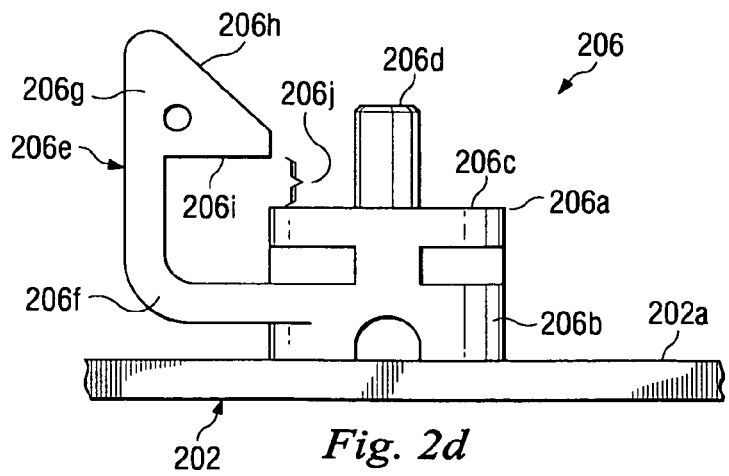
Figure 2A:
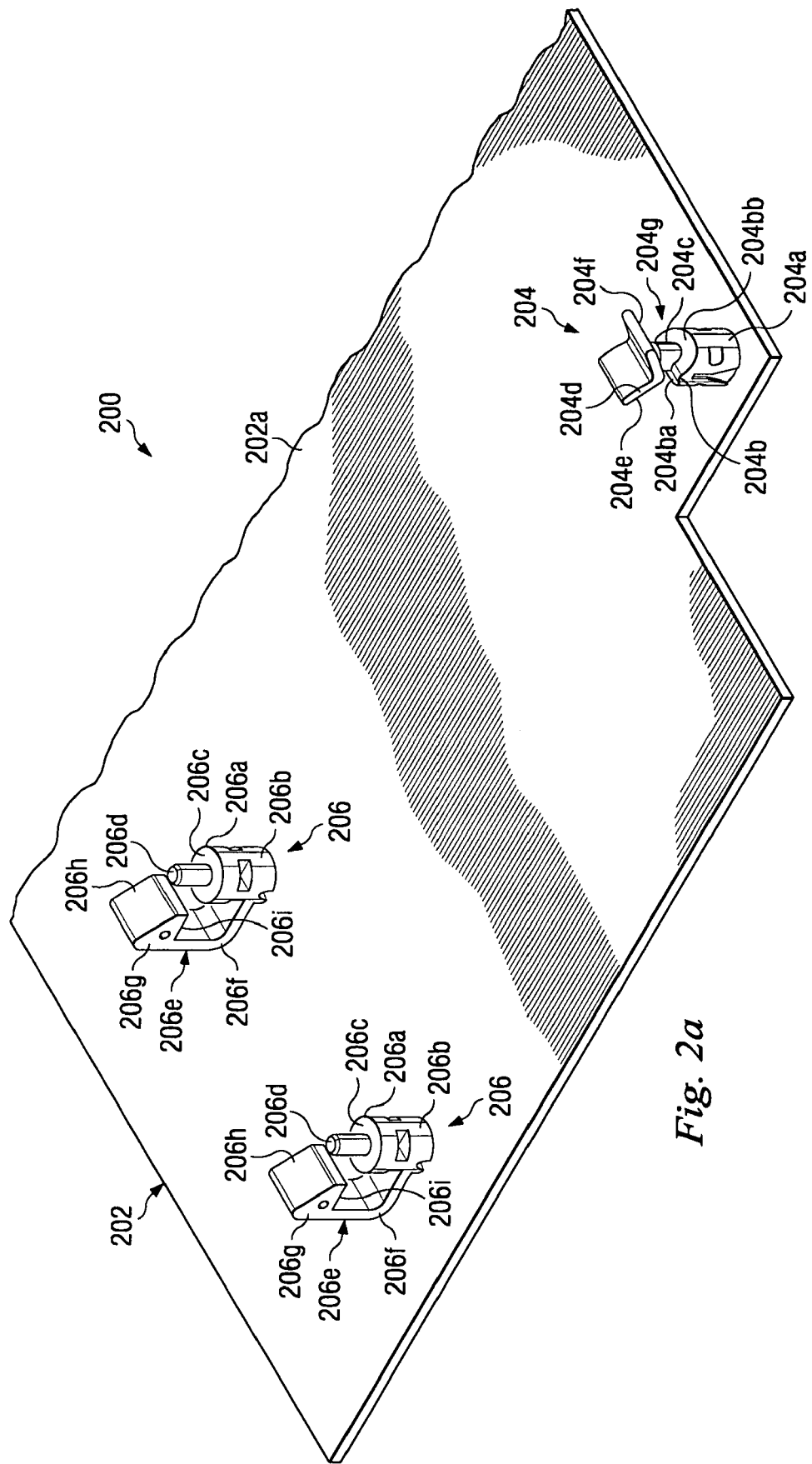
FIG. 2a is a perspective view illustrating an embodiment of a card coupling apparatus.

In one embodiment, IHS 100, FIG. 1, includes a processor 102, which is connected to a bus 104. Bus 104 serves as a connection between processor 102 and other components of computer system 100. An input device 106 is coupled to processor 102 to provide input to processor 102. Examples of input devices include keyboards, touchscreens, and pointing devices such as mouses, trackballs and trackpads. Programs and data are stored on a mass storage device 108, which is coupled to processor 102. Mass storage devices include such devices as hard disks, optical disks, magneto-optical drives, floppy drives and the like. IHS system 100 further includes a display 110, which is coupled to processor 102 by a video controller 112. A system memory 114 is coupled to processor 102 to provide the processor with fast storage to facilitate execution of computer programs by processor 102. In an embodiment, a chassis 116 houses some or all of the components of IHS 100. It should be understood that other buses and intermediate circuits can be deployed between the components described above and processor 102 to facilitate interconnection between the components and the processor 102.

Referring now to FIGS. 2a, 2b, 2c, and 2d, a card coupling apparatus 200 is illustrated. The card coupling apparatus 200 includes a base 202 having a first surface 202a. In an embodiment, the base 202 may be a board such as, for example, a PWA motherboard, that is mounted in a chassis which may be, for example, the chassis 116, described above with reference to FIG. 1, and may include components of an IHS such as, for example, the processor 102 of the IHS 100, described above with reference to FIG. 1. In an embodiment, the base 202 may be a chassis wall of a chassis such as, for example, the chassis 116, described above with reference to FIG. 1, and the first surface 202a may be a chassis wall surface on the chassis wall. A locating member 204 extends from the first surface 202a and includes a base 204a having a top surface 204b having two angled control surfaces 204ba and 204bb that are oriented at an angle relative to the first surface 202a. A locating member post 204c extends substantially perpendicularly from the top surface 204b of the base 204a and includes a control member 204d extending from its distal end. The control member 204d includes a control surface 204e that is oriented at an angle relative to the first surface 202a. The control member 204d also includes a control surface 204f located opposite the control surface 204e on the control member 204d. A securing channel 204g is defined adjacent the locating member post 204c and between the control member 204d and the top surface 204b of the base 204a. In an embodiment, the control member 204d and the locating member post 204c have a Y-shaped symmetrical cross section in order to reduce the chance of the locating member 204 being assembled to the base 202 in an incorrect orientation.

A plurality of securing devices 206 extend from the first surface 202a of the base 202 and are oriented in a spaced apart relationship from each other and the locating member 204 on the first surface 202a of the base 202. Each securing device 206 includes a base 206a having a side surface 206b located around the perimeter of the base 206a and a top surface 206c. A locating post 206d extends from the top surface 206c of the base 206a. A securing member 206e extends from the side surface 206b of the base 206a on a resilient beam 206f having a substantially 90 degree bend. A securing head 206g is located on a distal end of the resilient beam 206f and includes a beveled surface 206h and a securing surface 206i located adjacent the beveled surface 206h. A securing channel 206j is defined between the securing surface 206i and the top surface 206c of the base 206a.

Figure 3:
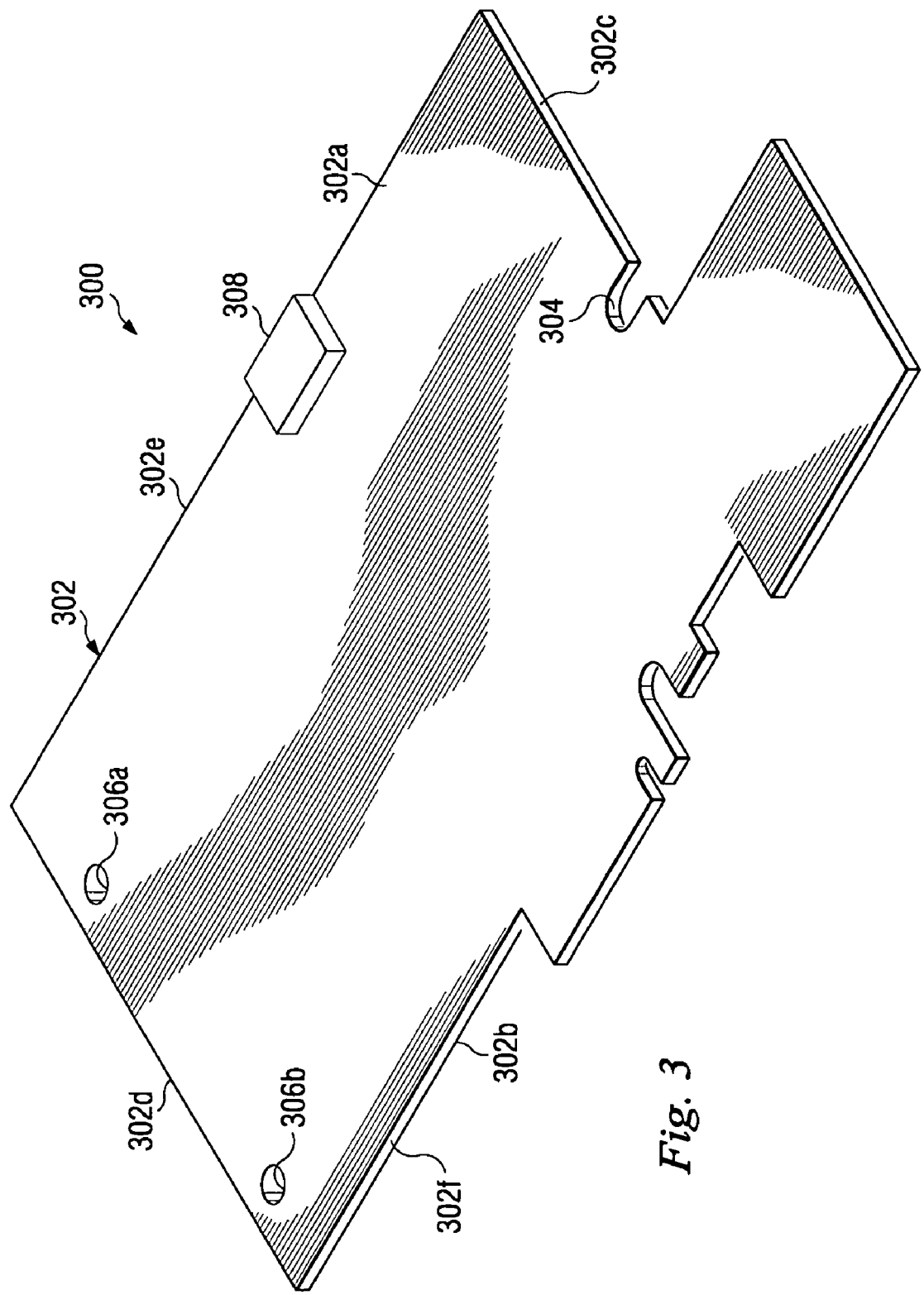
FIG. 3 is a perspective view illustrating an embodiment of a card used with the card coupling apparatus of FIGS. 2a, 2b, 2c, and 2d.

Referring now to FIG. 3, a card 300 is illustrated. In an embodiment, the card 300 may be, for example, a daughter PWA card. The card 300 includes a base 302 having a top surface 302a, a bottom surface 302b located opposite the top surface 302a, a front edge 302c extending between the top surface 302a and the bottom surface 302b, a rear edge 302d located opposite the front edge 302c and extending between the top surface 302a and the bottom surface 302b, and a pair of opposing side edges 302e and 302f extending between the top surface 302a, the bottom surface 302b, the front edge 302c, and the rear edge 302d. A locating member channel 304 is defined by the base 302 and located on the front edge 302c of the base 302. A plurality of apertures 306a and 306b are defined by the base 302, extend through the base 302 from the top surface 302a to the bottom surface 302b, and are located in a spaced apart relationship from each other and adjacent the rear edge 302d. An IHS connector 308 is located on the top surface 302a of the base 302 and adjacent the side edge 302e.

Figure 4A:
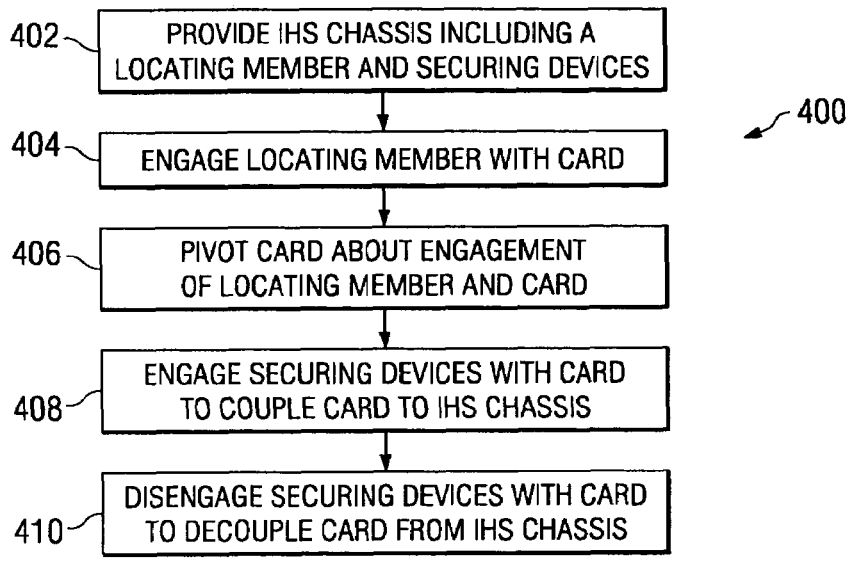
FIG. 4a is a flow chart illustrating an embodiment of a method for coupling a card to an IHS chassis.
Figure 4C:
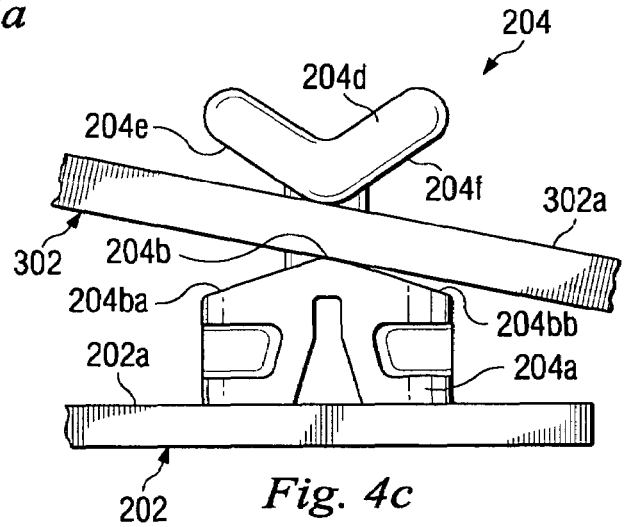
FIG. 4c is a side view illustrating an embodiment of the card of FIG. 3 being coupled to the locating member of FIGS. 2b and 2c.
Figure 4D:
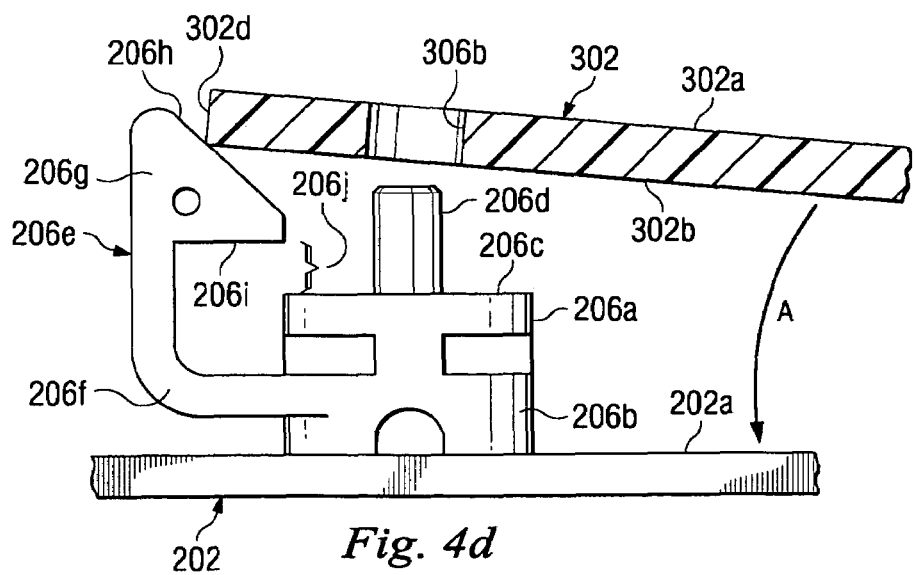
FIG. 4d is a side view illustrating an embodiment of the card of FIG. 3 being coupled to the securing device of FIG. 2c.
Figure 4B:
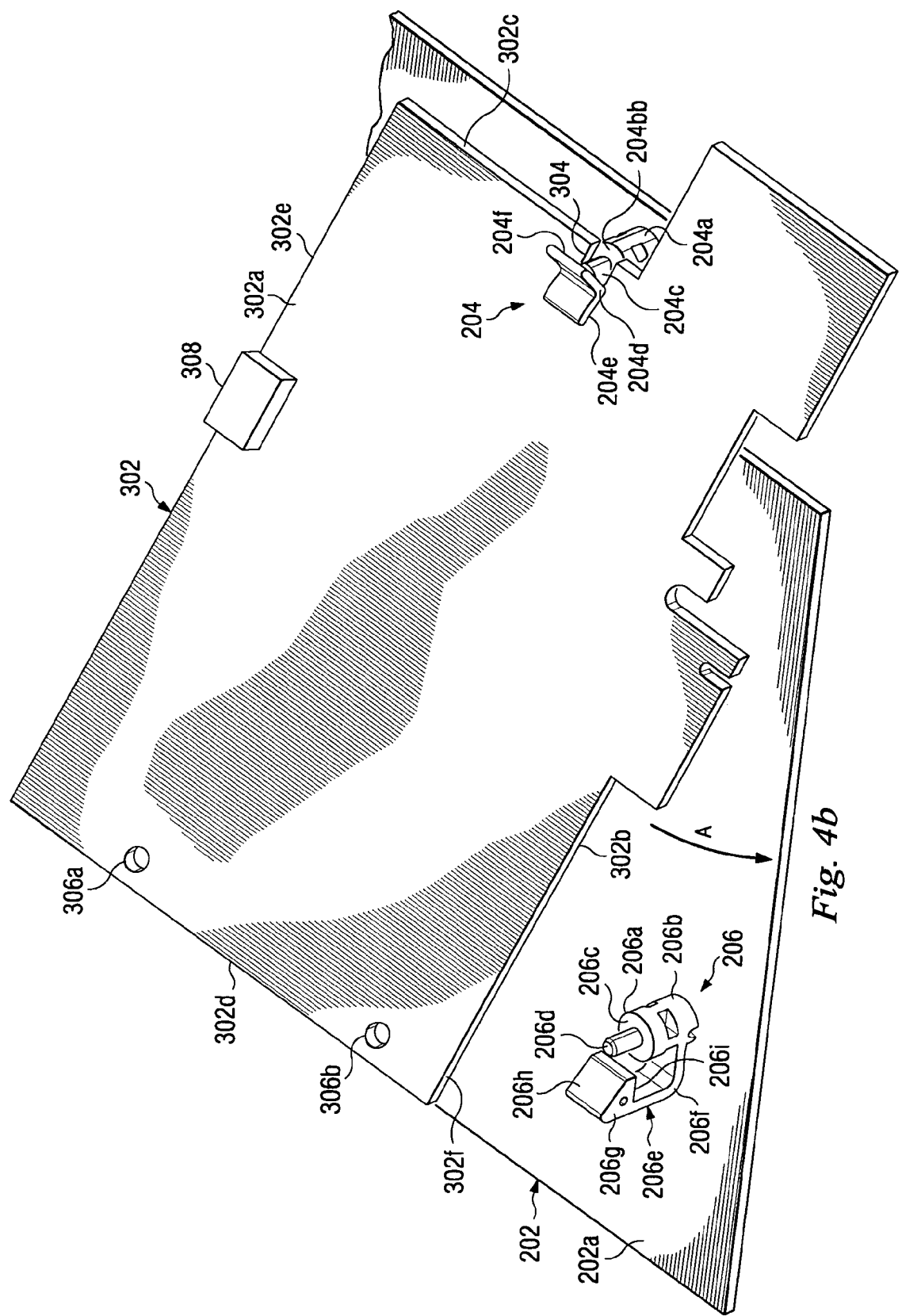
FIG. 4b is a perspective view illustrating an embodiment of the card of FIG. 3 being coupled to the card coupling apparatus of FIGS. 2a, 2b, 2c and 2d.

Referring now to FIGS. 2a, 2b, 2c, 3, 4a, 4b, 4c and 4d, a method 400 for coupling a card to a chassis is illustrated. The method 400 begins at step 402 where an IHS chassis is provided including the first surface 202a with the locating member 204 and the plurality of securing devices 206, described above with reference to FIGS. 2a, 2b and 2c. The method 400 then proceeds to step 404 where the locating member 204 is engaged with a card. The card 300, described above with reference to FIG. 3, is positioned adjacent the first surface 202a such that the bottom surface 302b of the card 300 is located adjacent the first surface 202a and the front edge 302c of the card 300 is located adjacent the locating member 204. The card 300 is then oriented at an angle relative to the first surface 202a and the locating member 204 is positioned in the locating member channel 304 on the card 300 such that the locating member post 204c on the locating member 204 engages the base 302 of the card 300 adjacent the locating member channel 304, as illustrated in FIG. 4b. The angle of the control surfaces 204e and 204bb on the locating member 204 relative to the first surface 202a are chosen in order to limit the angle of orientation of the card 300 relative to the first surface 202a during step 404 of the method 400 through the engagement of the card 300 and the control surfaces 204e and 204bb such that the card 300 will not be damaged during the engagement of the card 300 and locating member 204. The method 400 then proceeds to step 406 where the card 300 is pivoted about the engagement of the locating member 204 and the card 300. The card 300 is pivoted in a direction A about the engagement of the locating member post 204c and the base 302 adjacent the locating member channel 304 such that the rear edge 302d of the card 300 is moved towards the securing devices 206.

Figure 4E:
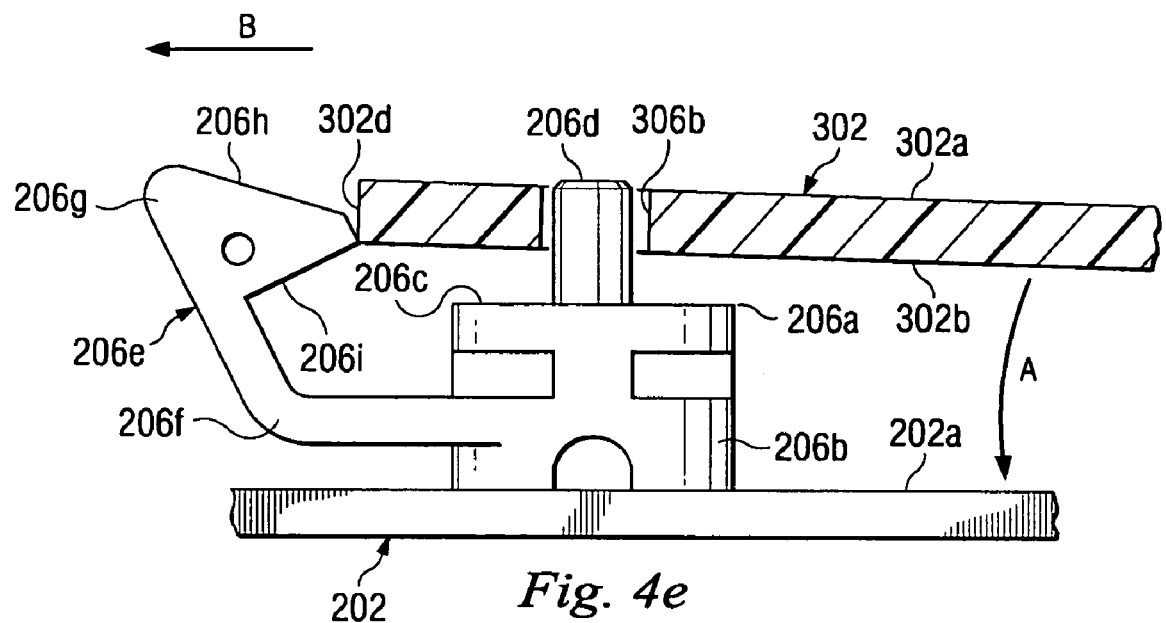
FIG. 4e is a side view illustrating an embodiment of the card of FIG. 3 being coupled to the securing device of FIG. 2c.
Figure 4F:
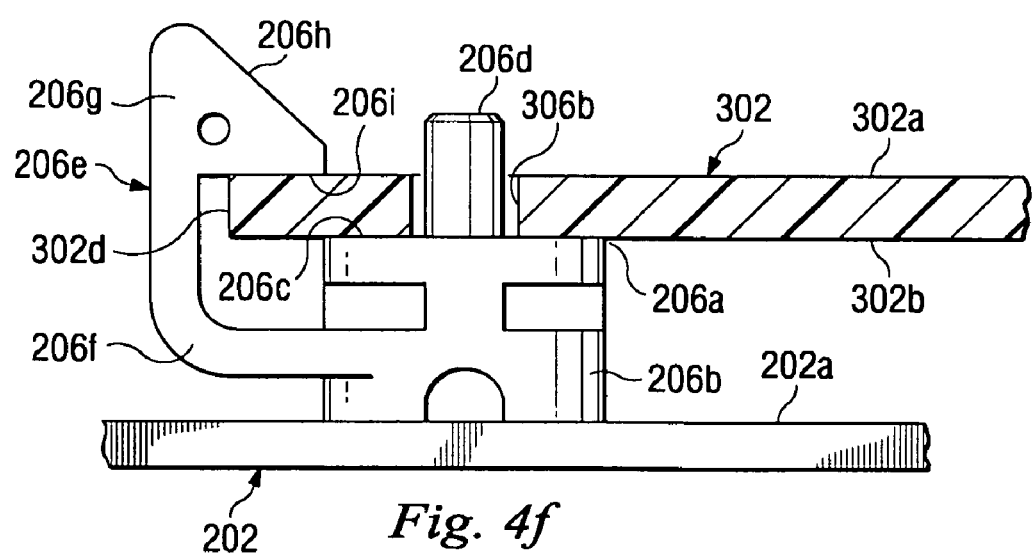
FIG. 4f is a side view illustrating an embodiment of the card of FIG. 3 coupled to the securing device of FIG. 2c.
Figure 4G:
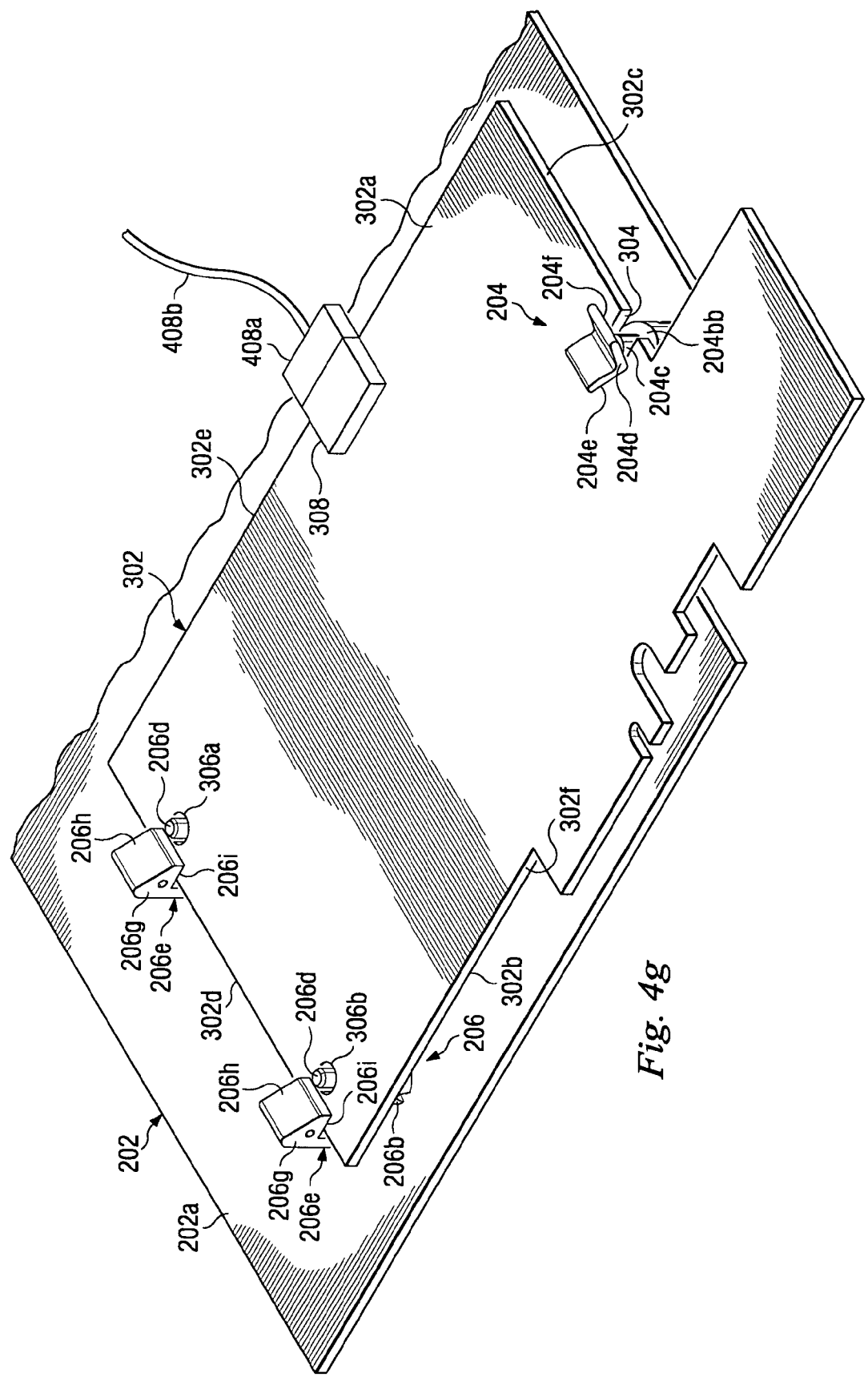
FIG. 4g is a perspective view illustrating an embodiment of the card of FIG. 3 coupled to the card coupling apparatus of FIGS. 2a, 2b, 2c, and 2d.
Figure 4H:
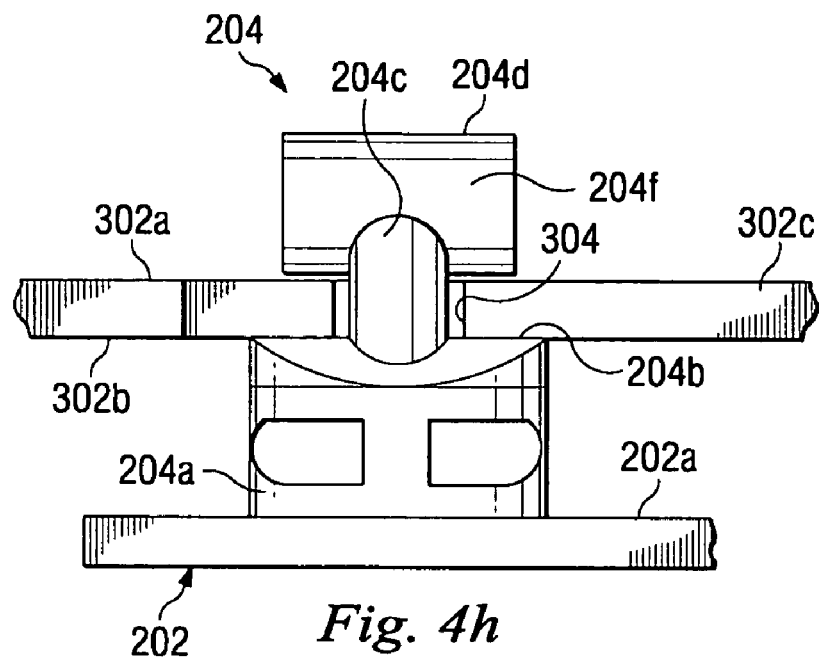
FIG. 4h is a rear view illustrating an embodiment of the card of FIG. 3 coupled to the locating member of FIG. 2b and 2c.
Figure 4I:
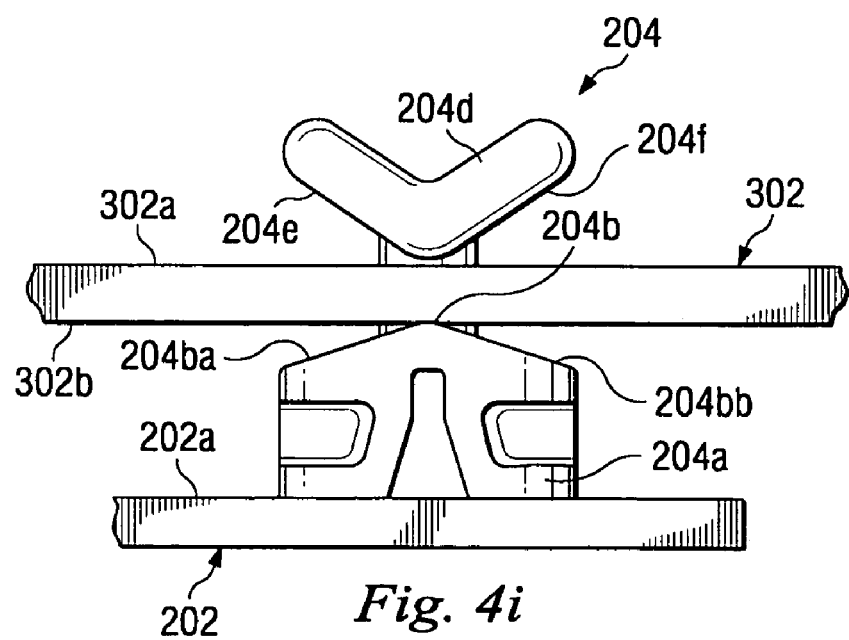
FIG. 4i is a side view illustrating an embodiment of the card of FIG. 3 coupled to the locating member of FIG. 2b and 2c.

Referring now to FIGS. 2a, 2b, 2c, 3, 4a, 4b, 4c, 4d, 4e, 4f, 4g, 4h and 4i, the method 400 then proceeds to step 408 where the securing devices 206 are engaged with the card 300 to couple the card 300 to the IHS chassis. The continued pivoting of the card 300 in the direction A from step 406 of the method 400 results in the engagement of the rear edge 302d of the card 300 and the beveled surface 206h on the securing member 206e of the securing devices 206. The locating posts 206d on the securing devices 206 are aligned with the apertures 306a and 306b defined by the card 300, and the card 300 continues to be moved in the direction A such that the securing member 206e is resiliently deflected in a direction B and the base 302 of the card 300 is allowed to move into the securing channel 206j, as illustrated in FIGS. 4d and 4e. The card 300 is coupled to the first surface 202a in the IHS chassis when the locating member post 204c on the locating member 204 is located in the locating member channel 304 defined by the card 300, with the base 302 of the card 300 that is located adjacent the locating member channel 304 located in the securing channel 204g, the base 302 of the card 300 located in the securing channels 206j on the securing devices 206, and the securing surfaces 206i on the securing members 206e engaging the top surface 302a of the card 300, as illustrated in FIGS. 4e, 4f and 4g. With the card 300 coupled to the card coupling apparatus 200, the card 300 is fixed in all 6 degrees of freedom. A card connector 408a that includes a cable 408b that may be electrically coupled to an IHS such as, for example, the IHS 100, described above with reference to FIG. 1, is coupled to the IHS connector 308 on the card 300, as illustrated in FIG. 4f, to electrically couple the card 300 to the IHS. The method 400 then proceeds to step 410 where the securing devices 206 are disengaged from the card 300 to decouple the card 300 from the first surface 202a in the IHS chassis. A user may use one hand to resiliently deflect the securing members 206e in the direction B with the users fingers such that the card 300 may be disengaged from the locating posts 206d with a thumb, as illustrated in FIG. 4d, and then grasped and disengaged from the locating member 204 to decouple the card 300 from the first surface 202a in the IHS chassis. Thus, embodiments are provided that allow a card to be coupled to an IHS chassis at a consistent height above a surface and then decoupled from the IHS chassis using one hand, allowing the card to be easily coupled to and decoupled from a variety of different surfaces in the IHS chassis.

Figure 5:
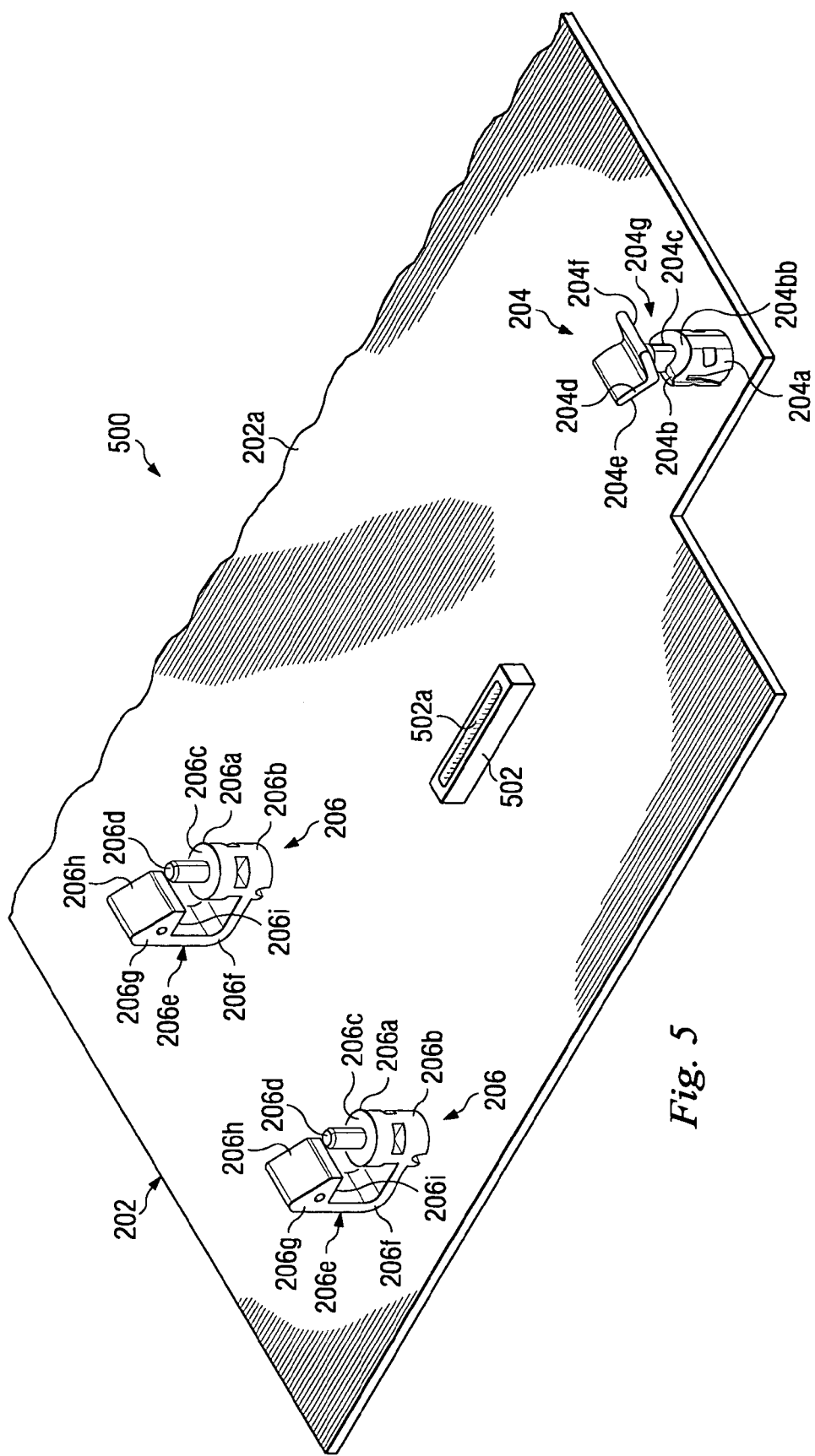
FIG. 5 is a perspective view illustrating an alternative embodiment of a card coupling apparatus.

Referring now to FIG. 5, in an embodiment, a card coupling apparatus 500 is substantially the same in design and operation as the card coupling apparatus 200, described above with reference to FIGS. 2a, 2b and 2c, with the provision of a card connector 502 defining a connector slot 502a located on the top surface 202a of the card 500 and approximately midway between the securing devices 206 and the locating member 204.

Figure 6:
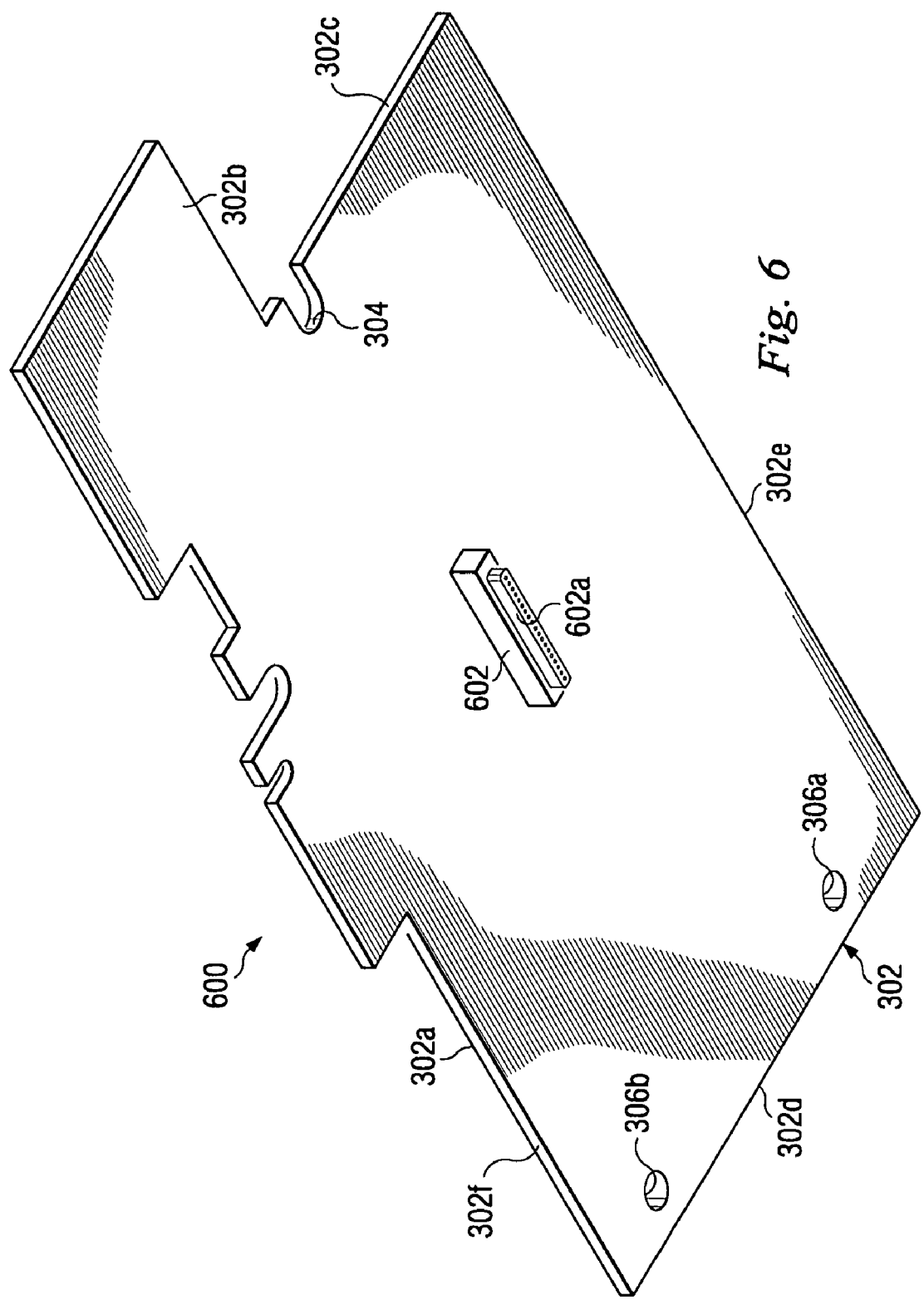
FIG. 6 is a perspective view illustrating an alternative embodiment of a card used with the card coupling apparatus of FIG. 5.

Referring now to FIG. 6, in an embodiment, a card 600 is substantially the same in design and operation as the card coupling apparatus 300, described above with reference to FIG. 3, with the provision of an IHS connector 602 including a connector plug 602a replacing the IHS connector 308. The IHS connector 602 extends from the bottom surface 302b of the card 300 and is located substantially centrally on the bottom surface 302b of the card 300.

In operation, the card coupling apparatus 500 and the card 600 may be used in place of the card coupling apparatus 200 and the card 300, respectively, during the operation of the method 400. However, during step 408 of the method 400, the connector plug 602a on the IHS connector 602 engages the connector slot 502a on the card connector 502 to electrically couple the card 600 to an IHS.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A card coupling apparatus, comprising:
   a first surface;
   a locating member extending from the first surface, comprising a Y-shaped cross section and a control surface that is oriented at an angle relative to the first surface, and defining a securing channel that is located adjacent the control surface; and
   a plurality of securing devices extending from the first surface in a spaced apart relationship from the locating member, each securing device comprising a locating post and a securing member located adjacent the locating post, wherein a card and the angle of the control surface relative to the first surface are chosen to limit the angle of orientation of the card relative to the first surface when the card engages the locating member and is pivoted such that the card may not be pivoted away from the securing devices by more than a predetermined angle that is less than 90 degrees.

2. The apparatus of claim 1, wherein the first surface comprises a Printed Wiring Assembly(PWA) board surface.

3. The apparatus of claim 1, wherein the first surface comprises a chassis wall surface.

4. The apparatus of claim 1, wherein the control surface is oriented at the predetermined angle relative to the first surface such that the card may engage the locating member at the predetermined angle relative to the first surface without damaging the card.

5. The apparatus of claim 1, wherein the securing member on each securing device is resiliently coupled to the securing device.

6. The apparatus of claim 1, wherein the securing members on the securing devices are operable to engage a card to couple the card to the first surface, whereby the card may be decoupled from the first surface by using one hand to disengage the securing members from the card and remove the card from the securing devices.

7. The apparatus of claim 1, wherein the locating member and the securing devices are operable to fix a card in all six degrees of freedom.

8. An information handling system (IHS), comprising:
   an IHS chassis;
   a processor located in the IHS chassis;
   a card connector electrically coupled to the processor;
   a first surface located in the IHS chassis;
   a locating member extending from the first surface, comprising a Y-shaped cross section and a control surface that is oriented at an angle relative to the first surface, and defining a securing channel that is located adjacent the control surface; and
   a plurality of securing devices extending from the first surface in a spaced apart relationship from the locating member, each securing device comprising a locating post and a securing member located adjacent the locating post, wherein a card and the angle of the control surface relative to the first surface are chosen to limit the angle of orientation of the card relative to the first surface when the card engages the locating member and is pivoted such that the card may not be pivoted away from the securing devices by more than a predetermined angle that is less than 90 degrees.

9. The system of claim 8, wherein the first surface comprises a Printed Wiring Assembly (PWA) board surface located on a PWA board that is mounted to the IHS chassis.

10. The system of claim 8, wherein the first surface comprises a chassis wall surface located on a chassis wall of the IHS chassis.

11. The system of claim 8, wherein the control surface is oriented at the predetermined angle relative to the first surface such that the card may engage the locating member at the predetermined angle relative to the first surface without damaging the card.

12. The system of claim 8, wherein the securing member on each securing device is resiliently coupled to the securing device.

13. The system of claim 8,
wherein the card defines a plurality of apertures and a locating member channel located on the card opposite the apertures, whereby the card is coupled to the first surface through the engagement of the card with the locating member and the securing devices, and the card is electrically coupled to the processor through the engagement of the card connector and the card.

14. The system of claim 13, wherein the securing members on the securing devices engage the card to couple the card to the first surface, whereby the card may be decoupled from the first surface by using one hand to disengage the securing members from the card and remove the card from the securing devices.

15. The system of claim 13, wherein the locating member and the securing devices fix the card in all six degrees of freedom.

16. A method for coupling a card to an IHS chassis, comprising:

providing an IHS chassis comprising a first surface that comprises a locating member and a plurality of securing devices extending from the first surface, wherein the located member comprising a Y-shaped cross section and a control surface that is oriented at an angle relative to the first surface;

engaging the locating member with a card, wherein the card and the angle of the control surface relative to the first surface are chosen to limit the angle of orientation of the card relative to the first surface when the card engages the locating member and is pivoted such that the card may not be pivoted away from the securing devices by more than a predetermined angle that is less than 90 degrees;

pivoting the card about the engagement of the locating member and the card; and coupling the card to the IHS chassis by engaging the securing devices with the card.

17. The method of claim 16, wherein the engaging the locating member with the card comprises engaging the control surface on the locating member that is orientated at an angle relative to the first surface such that the card may engage the locating member at an angle relative to the first surface without damaging the card.

18. The method of claim 16, further comprising:
decoupling the card from the IHS chassis by using one hand to disengage the securing devices from the card and remove the card from the securing devices.

* * * * *

UNITED STATES PATENT AND TRADEMARK OFFICE
CERTIFICATE OF CORRECTION

PATENT NO. : 7,583,517 B2
APPLICATION NO. : 11/481492
DATED : September 1, 2009
INVENTOR(S) : Hartman et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 567 days.

Signed and Sealed this

Fourteenth Day of September, 2010

David J. Kappos
*Director of the United States Patent and Trademark Office*